United States Patent [19]
Eguchi et al.

[11] Patent Number: 5,477,098
[45] Date of Patent: Dec. 19, 1995

[54] EFFICIENT SURFACE ACOUSTIC WAVE DEVICE CAPABLE OF EXCITATION IN PLURAL FREQUENCY BANDS, AND SIGNAL RECEIVER AND COMMUNICATION SYSTEM UTILIZING THE SAME

[75] Inventors: Tadashi Eguchi, Kawasaki; Akira Torisawa, Machida; Norihiro Mochizuki, Yokohama; Koichi Egara, Tokyo; Akihiro Koyama; Takahiro Hachisu, both of Yokohama, all of Japan

[73] Assignee: Canon Kabushiki Kaisha, Tokyo, Japan

[21] Appl. No.: 250,901

[22] Filed: May 31, 1994

[30] Foreign Application Priority Data

May 31, 1993 [JP] Japan .................................. 5-149846
May 27, 1994 [JP] Japan .................................. 6-115084

[51] Int. Cl.⁶ .................................................. H03H 9/145
[52] U.S. Cl. ........................... 310/313 R; 310/313 B; 310/313 D; 364/821
[58] Field of Search ........................ 310/313 B, 313 D, 310/313 R; 333/154, 193, 195; 364/821

[56] References Cited

U.S. PATENT DOCUMENTS

| | | | |
|---|---|---|---|
| 4,028,649 | 6/1977 | Komatsu et al. | 333/72 |
| 4,649,509 | 3/1987 | Engan | 364/821 |
| 4,841,470 | 6/1989 | Okamoto et al. | 364/821 |
| 5,003,213 | 3/1991 | Mochuzuki et al. | 310/313 D |
| 5,185,548 | 2/1993 | Egara et al. | 310/313 D |
| 5,189,330 | 2/1993 | Niitsuma | 310/313 B |
| 5,336,957 | 8/1994 | Yamanouchi et al. | 310/313 D |

FOREIGN PATENT DOCUMENTS

| | | | |
|---|---|---|---|
| 18036012 | 3/1983 | Japan | 310/313 B |
| 565971 | 3/1993 | Japan . | |
| 15055861 | 3/1993 | Japan | 333/193 |
| 15129887 | 5/1993 | Japan | 333/193 |
| 6314946 | 11/1994 | Japan | H03H 9/145 |

OTHER PUBLICATIONS

Shibayama, "Application of Surface Acoustic Wave", Television, 30, pp. 457–463 (Jun. 1976) (and pertinent English translation).

Nikkan Kogyo Shimbun, "Surface Acoustic Wave Device and its Application", edited by Electronic Material Industry Association, pp. 165–167 (and pertienent English translation).

*Primary Examiner*—Thomas M. Dougherty
*Attorney, Agent, or Firm*—Fitzpatrick, Cella, Harper & Scinto

[57] ABSTRACT

A surface acoustic wave device includes a piezoelectric substrate, a wave guide path provided on the piezoelectric substrate and an interdigital transducer for exciting a surface acoustic wave. The interdigital transducer is provided with plural portions of mutually different pitches of the electrode finger, respectively corresponding to different frequencies. The portions are parallelly arranged along a direction perpendicular to the propagation direction of the surface acoustic wave. The surface acoustic wave generated by the interdigital transducer is entered in concentrated manner into the wave guide path.

28 Claims, 11 Drawing Sheets

GND ELECTRODE

SIGNAL ELECTRODE (NO DELAY)

SIGNAL ELECTRODE (60° PHASE DELAY)

13 : IDT PORTION FOR HIGH FREQUENCY EXCITATION
14 : IDT PORTION FOR INTERMEDIATE FREQUENCY EXCITATION
15 : IDT PORTION FOR LOW FREQUENCY EXCITATION $O_1$ : CENTER OF CURVATURE OF IDT PORTION 13
$O_2$ : CENTER OF CURVATURE OF IDT PORTION 14
$O_3$ : CENTER OF CURVATURE OF IDT PORTION 15

EFFICIENT SURFACE ACOUSTIC WAVE DEVICE CAPABLE OF EXCITATION IN PLURAL FREQUENCY BANDS, AND SIGNAL RECEIVER AND COMMUNICATION SYSTEM UTILIZING THE SAME

BACKGROUND OF THE INVENTION

1. Field of the Invention

The present invention relates to a surface acoustic wave device such as a surface acoustic wave convolver, and a signal receiver and a communication system utilizing the same.

2. Related Background Art

A surface acoustic wave device, particularly a surface acoustic wave convolver, is increasingly considered important as the key device in the spread spectrum communication, and is recently the target of intense development.

Figure 1:
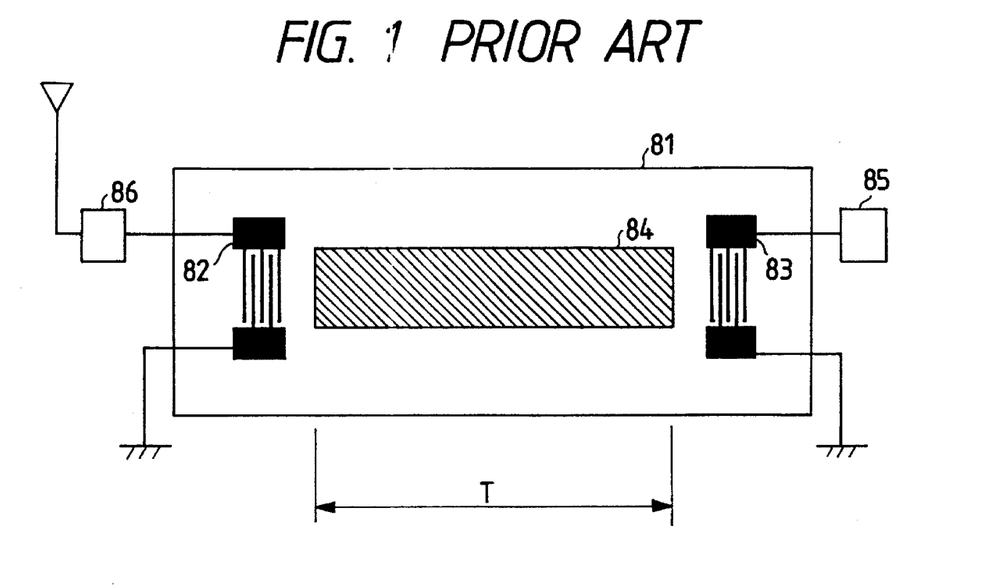
FIG. 1 is a view showing the working principle of a conventional surface acoustic wave convolver.

FIG. 1 is a schematic view showing the concept of such conventional surface acoustic wave device. There are provided a piezoelectric substrate 81 composed for example of Y-cut(Z-propagation) lithium niobate; comb-shaped electrodes or interdigital transducers (IDT) 82, 83 formed on the surface of the piezoelectric substrate 81; and an output electrode 84 formed on the piezoelectric substrate 81.

These electrodes are composed of a conductive material such as aluminum, and are usually formed by a photolithographic process.

There are also shown a PN code generator 85, and an input circuit 86.

In the surface acoustic wave device of the above-explained structure, an electrical signal of a carrier angular frequency $\omega$ supplied to the input IDT 82 induces a surface acoustic wave by the piezoelectric effect of the substrate. Similarly an electrical signal of a carrier angular frequency $\omega$ supplied to the IDT 83 induces another surface acoustic wave. By causing these two surface acoustic waves to propagate in mutually opposite directions on the piezoelectric substrate, a convolution signal (carrier angular frequency $2\omega$)) of the two input signals can be obtained from the output electrode, by means of the physical non-linear effect of the piezoelectric substrate.

On a coordinate system with the x-axis taken along the wave guide path and the original point taken at the left-hand end thereof, the two surface acoustic waves can be represented as:

$$F(t-x/v)e^{j(\omega t-kx)}, G(t+x/v)e^{j(\omega t+kx)}$$

and the non-linear interaction of these two waves generates, as the product, a surface acoustic wave independent of the location:

$$F(t-x/v) \cdot G(t+x/v)e^{j2\omega t}$$

on the piezoelectric substrate.

By forming a uniform output electrode, this signal is integrated within the length of the electrode, and can be taken out as a signal represented by:

$$S(t)=Ke^{j2\omega t}\int F(t-x/v) \cdot G(t+x/v)dx \quad (1)$$

within the length of interaction under the output electrode. The range of integration can be practically considered as $\pm\infty$ if the length of interaction is sufficiently larger than the signal length, and, by taking $\tau=t-x/v$, the equation (1) can be rewritten as:

$$S(t)=-vKe^{j2\omega t}\int F(\tau) \cdot G(2t-\tau)d\tau \quad (2)$$

so that said signal becomes the convolution of the input signals.

The mechanism of such convolution is detailedly explained, for example, by Shibayama; "Application of surface acoustic wave", Television, 30, 457(1976).

As explained in the foregoing, the convolver utilizing the surface acoustic waves obtains, by means of the configuration shown in FIG. 1, the convolution output of a detected signal and a reference signal. The output electrode 84 shown in FIG. 1 also serves as a wave guide path utilizing an effect of electrical shortcircuiting of the surface of the piezoelectric substrate when a thin metal film is evaporated thereon, and an effect of concentration of the surface acoustic wave, as the velocity thereof is reduced by the mass load effect of the evaporated metal.

As the efficiency of convolution is proportional to the square of energy density, the output electrode serving also as the wave guide path is required to be as narrow as possible, within an extent that the convolution output can be taken out, in order to prevent-the higher-order transversal propagation modes and to increase the energy density. On the other hand, a narrower wave guide path increases the variation in velocity dependent on the frequency. In consideration of these factors, the width of the wave guide path in a Z-propagation convolver employing Y-cut lithium niobate is generally selected within a range of 1.5$\lambda$ to 4$\lambda$, wherein $\lambda$ is the wavelength of the Z-propagating surface acoustic waves.

On the other hand, in the input IDT for converting the electrical signal into the surface acoustic wave signal, the proportion of conversion of the electrical energy into the energy of surface acoustic wave is determined by the electromechanical coupling coefficient of the substrate. Consequently the number of fingers of IDT has to be increased if the electromechanical coupling coefficient is small.

However, as an increase in the number of fingers of the IDT reduces the band width, there have been conceived various electrode structures with frequency dispersing property, capable of inducing the surface acoustic wave in a wider frequency range.

As described in "Surface acoustic wave device and its application" edited by Electronic Material Industry Association and published by Nikkan Kogyo Shimbun, 3. Delay line; 3.1 Non-dispersing delay line; 3.1.1 Band spreading, an electrode structure with such frequency dispersing property utilizes an IDT having plural pitches for oscillation in plural frequency bands and provided in a direction perpendicular to the propagating direction of the surface acoustic wave.

Figure 2:
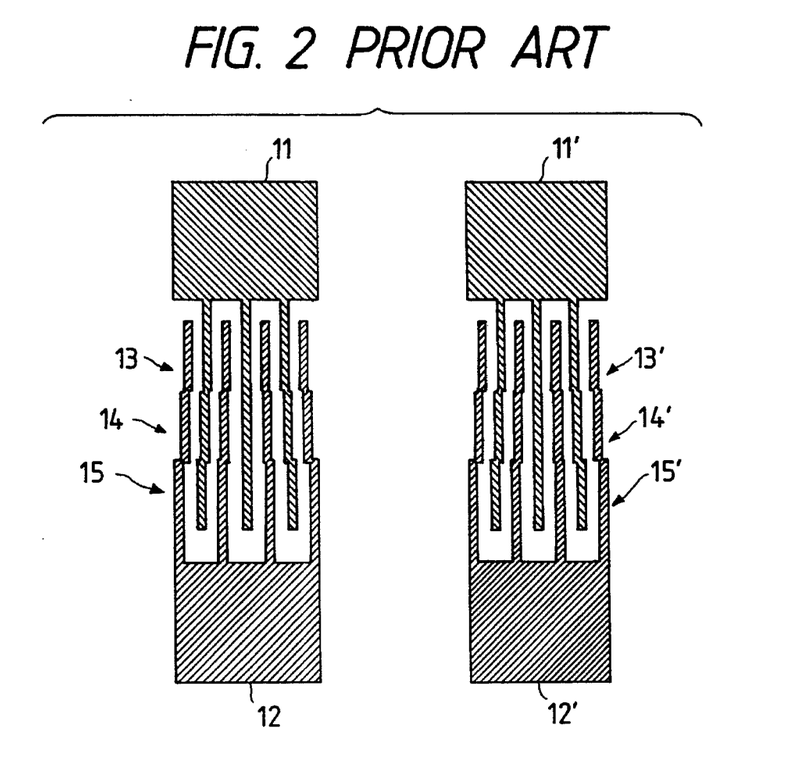
FIG. 2 is a schematic view showing the shape of input IDT's of a surface acoustic wave convolver, with a structure of plural pitches for exciting plural frequency bands and with said pitches arranged in a direction perpendicular to the propagating direction of the surface acoustic wave.

FIG. 2 is a schematic view showing the shape of the input IDT of a surface acoustic wave convolver, having a structure provided with plural pitches for inducing excitation in such plural frequency bands, and featured by a fact that such structures are positioned in a direction perpendicular to the propagating direction of the surface acoustic waves. In FIG. 2 there are illustrated wire bonding pads 11, 12 (11', 12'); high frequency oscillating IDT portions 13 (13'); intermediate frequency oscillating IDT portions 14 (14'); and low frequency oscillating IDT portions 15 (15').

There is also known so-called chirping electrode in which the pitch of fingers of the IDT electrodes is not constant. U.S. Pat. No. 4,649,509 (1987) describes a convolver with a dispersive input IDT, utilizing such chirping electrodes in which the IDT is shaped as an iso-phase plane of the surface acoustic wave emerging from the wave guide path. However, there is not given a clear explanation on the frequency dispersing means of such frequency dispersive IDT, except that the spacing of the electrode fingers is not constant.

Such conventional chirping electrodes have been associated, however, with the following drawbacks that:

(1) the loss inside the electrodes is large;

(2) the surface acoustic waves of different frequencies, being excited in the different locations on the electrode in the propagating direction of the surface acoustic waves, require different times for reaching the output integrating electrode, so that the peaks of convolution outputs are mutually displaced between the high and low frequencies; and (3) with an increase in the number of electrode fingers, a next chip in the pseudo noise signal used in the SS communication is excited before a surface acoustic wave, excited in a portion of the IDT distant from the wave guide path, can pass a portion of the IDT close to the wave guide path, so that the signal is integrated over a range longer than the one-chip length of the pseudo noise signal and is therefore blunted, and these drawbacks result in the loss in the convolution efficiency.

Also the IDT as shown in FIG. 2 has a drawback that it cannot concentrate the surface acoustic wave.

SUMMARY OF THE INVENTION

The object of the present invention is to provide a surface acoustic wave device capable of excitation in plural frequency bands, which is highly efficient with limited loss in the electrodes and without aberration between the output peaks of the high and low frequency components and which is capable of providing signals of higher quality and concentrating the surface acoustic waves.

The above-mentioned object can be attained, according to the present invention, by a surface acoustic wave device comprising:

a piezoelectric substrate;

a wave guide path formed on the piezoelectric substrate for guiding a surface acoustic wave; and interdigital transducer electrodes provided on the piezoelectric substrate for exciting a surface acoustic wave;

wherein the interdigital transducer electrodes have plural portions of mutually different pitches of the electrode fingers respectively corresponding to different frequencies, and said portions are arranged in parallel manner along a direction perpendicular to the propagating direction of the surface acoustic wave, and wherein the surface acoustic wave generated by the interdigital transducer electrodes is entered in concentrated manner into the wave guide path.

According to the present invention, there is also provided a surface acoustic wave device comprising:

a piezoelectric substrate;

plural interdigital transducer electrodes formed on the piezoelectric substrate for exciting a surface acoustic wave;

wherein the interdigital transducer electrodes have plural portions of mutually different pitches of the electrode fingers respectively corresponding to different frequencies, and said portions are arranged in parallel manner along a direction perpendicular to the propagating direction of the surface acoustic wave; and a wave guide path formed on the piezoelectric substrate for outputting a convolution signal obtained from surface acoustic waves excited by the plural interdigital transducer electrodes;

wherein the surface acoustic wave generated by the interdigital transducer electrodes is entered in concentrated manner into the wave guide path.

According to the present invention, there is provided a signal receiver comprising:

a code generator for generating a reference signal;

a surface acoustic wave device for outputting a convolution signal of a received signal and the reference signal; and a circuit for demodulating information, utilizing the convolution signal outputted from the surface acoustic wave device;

wherein the acoustic surface wave device includes:

a piezoelectric substrate;

plural interdigital transducers provided on the piezoelectric substrate, for exciting surface acoustic waves, each of the interdigital transducers being provided with plural portions of mutually different pitches of the electrode fingers, respectively corresponding to different frequencies, and said portions being arranged in parallel manner in a direction perpendicular to the propagating direction of the acoustic waves; and a wave guide path provided on the piezoelectric substrate, for outputting a convolution signal by the surface acoustic waves excited by the plural interdigital transducers;

wherein the surface acoustic waves generated by the interdigital transducers are entered in concentrated manner into the wave guide path.

According to the present invention, there is also provided a communication system comprising:

a transmitter for transmitting a signal modulated according to information; and a receiver including:

a code generator for generating a reference signal;

a surface acoustic wave device for outputting a convolution signal of a received signal and the reference signal; and a circuit for demodulating information, using the convolution signal outputted from the surface acoustic wave device, the surface acoustic wave device including:

a piezoelectric substrate;

plural interdigital transducers provided on the piezoelectric substrate, for exciting surface acoustic waves; each of the interdigital transducers being provided with plural portions of mutually different pitches of the electrode fingers, respectively corresponding to different frequencies, and said portions being arranged in parallel direction of the surface acoustic waves; and a wave guide path provided on the piezoelectric substrate, for outputting a convolution signal by the surface acoustic wave excited by the plural interdigital transducers;

wherein the surface acoustic waves generated by said interdigital transducers in the surface acoustic wave device are entered in concentrated manner into the wave guide path.

BRIEF DESCRIPTION OF THE DRAWINGS

FIGS. 5A to 5C are views showing configurations in which, as a third embodiment of the present invention, plural frequency exciting portions of the IDT of convolver are connected in parallel, wherein FIG. 5A shows a configuration in which the electrodes are mutually connected with wires, FIG. 5B shows a configuration in which an electrode finger closest to the wave guide path and an electrode finger farthest from the wave guide path serve also as wires to other electrodes, and FIG. 5C shows a configuration in which the external circuit is non-equibrized and the wire of an electrode (ground electrode) of the IDT reaching wave is between two IDT's of the convolver;

FIGS. 6A to 6C are views showing configurations in which, as a fourth embodiment of the present invention, the IDT of convolver is formed as so-called dog-legged IDT, wherein FIG. 6A shows a configuration in which the IDT of the present invention is realized with an ordinary dog-legged IDT, FIG. 6B shows a configuration in which intermediate electrodes of a same potential are mutually connected, and FIG. 6C shows a configuration in which the excited frequency bands are opposite to those in the configuration shown in FIG. 6C;

DETAILED DESCRIPTION OF THE PREFERRED EMBODIMENTS

[Embodiment 1]

Figure 3A:
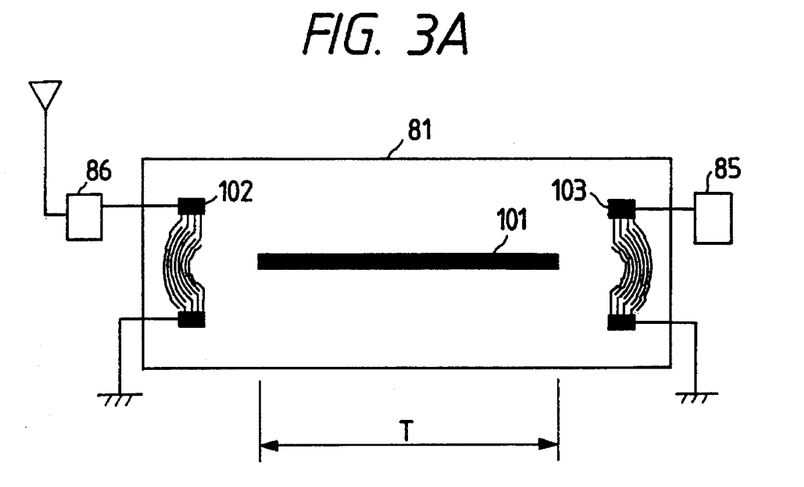
FIG. 3A is an entire view of a surface acoustic wave convolver constituting a first embodiment of the present invention.

FIG. 3A is a schematic plan view of a first embodiment of the surface acoustic wave device of the present invention, wherein same components as those in FIG. 1 are represented by same numerals and will not be explained further. In the present embodiment, in the interdigital transducers 102, 103 for generating surface acoustic waves in response to the input signals, the electrode fingers are formed concave to the wave guide path 101, whereby the surface acoustic waves supplied from the interdigital transducers 102, 103 to the wave guide path 101 are concentrated. Also the wave guide path 101, for obtaining the convolution signal of the two input signals, is formed with a small width for transmitting the concentrated surface acoustic waves. Furthermore, the interdigital transducers 102, 103 are provided with plural portions of mutually different pitches of the electrode fingers, respectively corresponding to different frequency bands, and these portions are arranged in parallel manner in a direction perpendicular to the propagating direction of the surface acoustic wave.

Figure 3B:
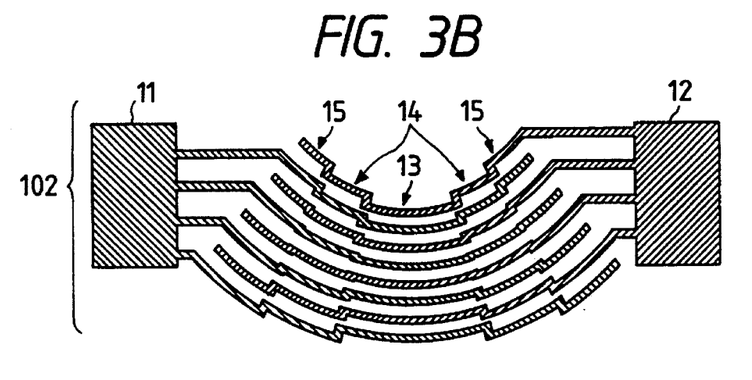
FIG. 3B is a schematic view showing the shape of input interdigital transducer electrodes of the embodiment.

FIG. 3B is a schematic plan view, showing the details of the structure of the interdigital transducers 102, 103 shown in FIG. 3A.

In FIG. 3B there are shown wire bonding pads 11, 12; a high frequency exciting IDT portion 13; an intermediate frequency exciting portion 14; and a low frequency exciting IDT portion 15, wherein the IDT portions are formed with arcs having a common center of curvature. Each IDT excites a surface acoustic wave of which wavelength corresponds to the distance between the centers of electrode fingers belonging to a same pole and surface acoustic waves of close frequencies. The central angle of each IDT portion is selected that the frequency characteristics of the entire IDT of the present invention become as flat as possible.

Each IDT excites a surface acoustic wave of a wavelength corresponding to the distance between the centers of the electrode fingers belonging to a same pole, and surface acoustic waves of close frequencies. The frequency characteristics of each IDT portion are considerably complex, but can be approximately simulated with a δ function model. If all adjust electrode fingers are of mutually opposite polarities, and if a center of distortion of a form of δ function is present at the center of the electrode finger, the frequency characteristics of each IDT portion are represented by the following equation:

$$|H(\omega)| = C \left| \sin\left( \frac{\pi f}{2f_0} \right) \right| \times \left| \frac{\sin(N\pi f/f_0)}{\sin(\pi f/f_0)} \right|$$

wherein H(ω) stands for the intensity, f for frequency, $f_0$ for the central frequency of IDT, N for the number of electrode fingers and C for a constant. The constant C is proportional to the electric field applied between the electrode fingers, and the overlapping length (electrode length) between the electrode fingers constituting each pair.

The frequency characteristics of the IDT of the convolver of the present invention are represented by the sum of the frequency characteristics of the IDT portions. In the configuration shown in FIG. 3B, as the different IDT portions receive a same voltage, the intensity of electric field becomes highest in the high frequency exciting portion where the pitch is smallest. As the central angle of arc of each IDT portion is proportional to the electrode length, said central angles are so selected that the frequency characteristics of the entire IDT of the present invention become as flat as possible. The IDT portions are designed in consideration of the following three factors:

1) electric impedance of each portion;
2) intensity distribution of the surface acoustic wave excited in each portion; and
3) coupling coefficient with the wave guide mode of the surface acoustic wave excited in each portion.

The wave guide path of the convolver is generally made as narrow as possible within an extent not hindered by the electric resistance, in order to prevent generation of higher-order wave guide mode, since such higher-order wave guide mode deteriorates the efficiency of convolution. However, the first-order mode is generated even with such a width of the wave guide path where the electrical resistance thereof becomes a problem. In a convolver with a symmetrical wave guide path with respect to the crystalline orientation of the substrate, such as a Z-propagation convolver formed on Y-cut lithium niobate or a convolver formed on a thin zinc oxide film, the basic (0-th order) mode becomes completely symmetrical while the 1st order mode becomes asymmetric. Consequently, the generation of the 1st-order mode can be suppressed by exciting the surface acoustic waves by the IDT's as symmetrically as possible with respect to the wave guide path.

[Embodiment 2]

Figure 4:
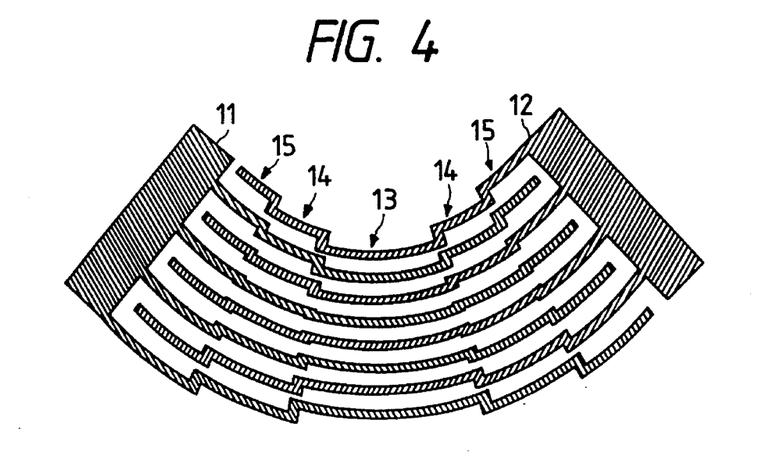
FIG. 4 is a schematic view showing the shape of input IDT of a surface acoustic wave device constituting a second embodiment of the present invention.

FIG. 4 is a schematic view of a second embodiment of the input IDT of the convolver of the present invention. In this IDT, the base portion of each electrode finger, connecting a portion of the electrode finger overlapping with the adjacent electrode finger, and the wire bonding pad 11 or 12 for injecting electrical energy into the electrode finger, is made as short as possible within an extent that the surface acoustic wave excited by the IDT does not proceed to said bonding pad. In case of the configuration as shown in FIG. 3B with narrow electrode fingers, if the above-mentioned base portion of each electrode finger, connecting the portion of each electrode finger overlapping with the adjacent electrode finger and the wire bonding pad for electric energy injection, is made longer, the resistance loss and the inductive component in such base portion does not become negligible. However the configuration as shown in FIG. 4 can reduce the influence of such resistance loss and inductive component in the electrode fingers.

[Embodiment 3]

Figure 5A:
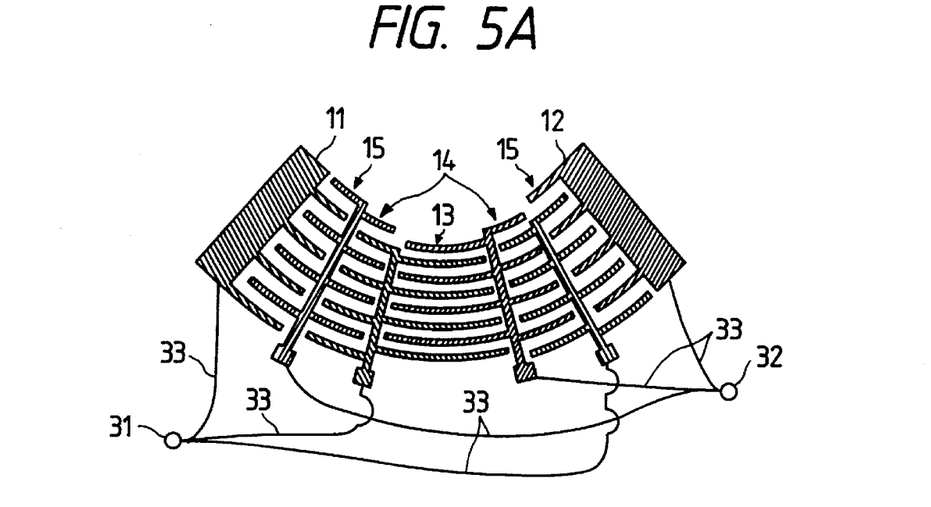
Figure 5B:
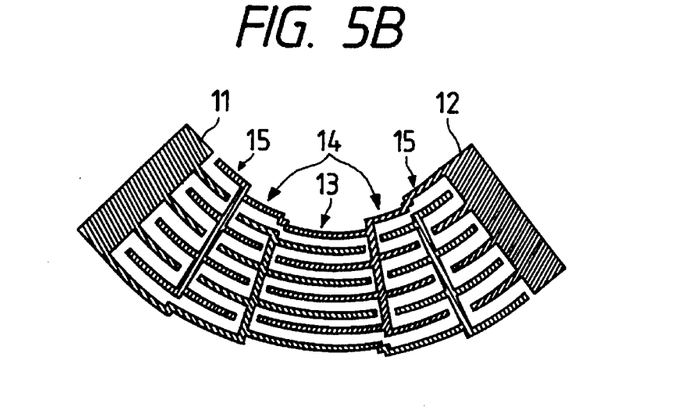
Figure 5C:
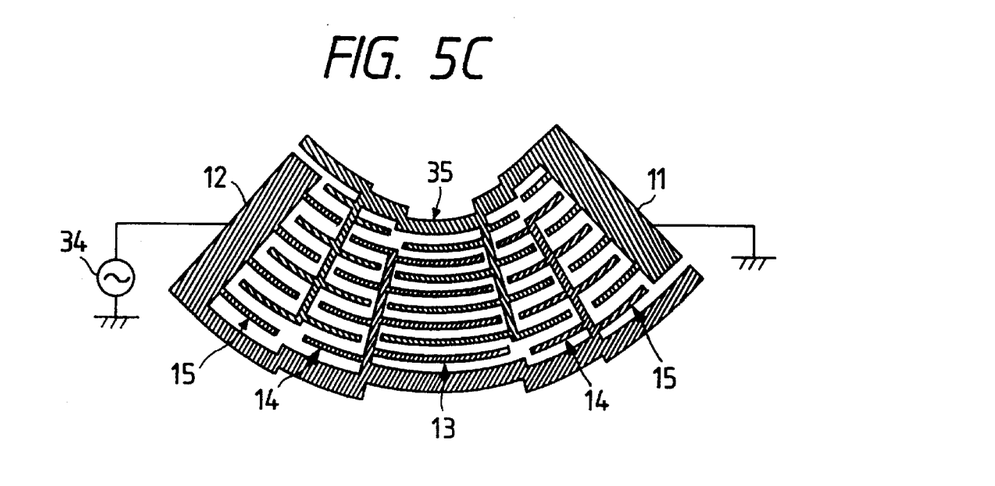

FIGS. 5A, 5B and 5C illustrate examples in which, as in the first and second embodiments, the plural frequency exciting portions in the IDT of the convolver of the present invention are connected in parallel, and such parallel configuration reduces the impedance of the IDT, thereby facilitating the matching with the external circuits. More specifically, FIG. 5A shows a configuration in which the electrodes are mutually connected with wires 33; FIG. 5B shows a configuration in which an electrode finger closest to the wave guide path and another electrode finger farthest therefrom serve also as connecting wires to the electrodes; and FIG. 5C shows a configuration in which the external circuit is a non-equilibrium circuit and the wire of one of the electrodes (ground electrode) of the IDT serves also as a shield electrode for avoiding so-called direct reaching wave between two IDT's.

If the electrode fingers are formed narrow in the configuration as shown in FIG. 3B or FIG. 4, the resistance loss and the inductive component in the electrode fingers of IDT become no longer negligible. However the influence of such resistance loss and inductive component can be reduced by the configuration shown in FIG. 5A, because the electrical energy can be injected from plural points. The configuration shown in FIG. 5C has the same effect since the electrical energy can be supplied to the electrode fingers from the shield electrode 35 of a lower resistance.

[Embodiment 4]

Figure 6A:
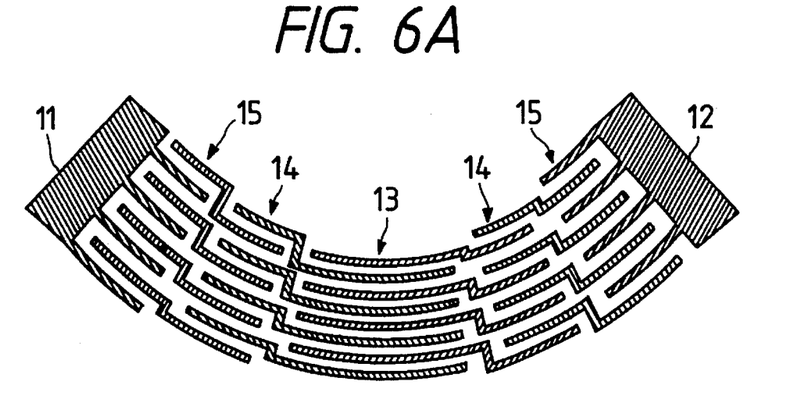
Figure 6B:
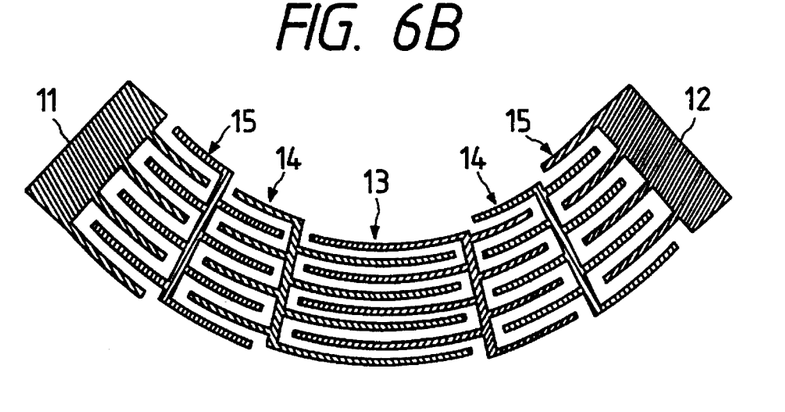
Figure 6C:
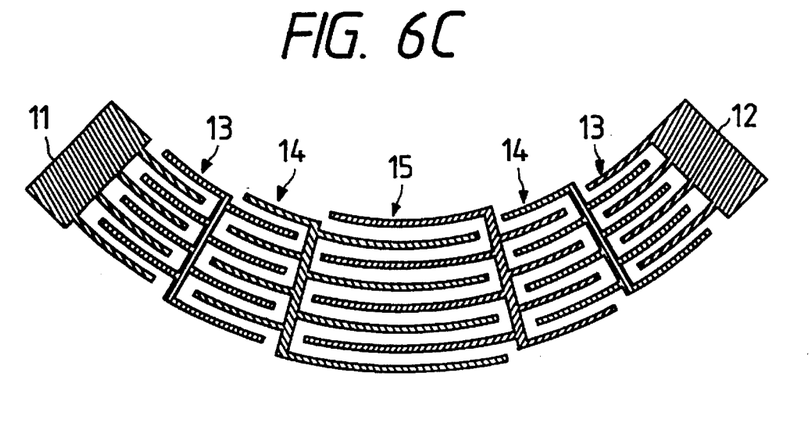

FIGS. 6A, 6B and 6C illustrate configurations in which the IDT of the convolver of the present invention is constructed as a serially connected IDT, and, in this embodiment, the IDT employs a dog-legged or staggered configuration. The serially connected structure can suppress the influence in case a wire breakdown takes place in a part of the IDT. FIG. 6A shows a configuration in which the IDT of the present invention is realized with an ordinary dog-legged IDT; FIG. 6B shows a configuration in which intermediate electrodes of a same potential are mutually connected in the configuration shown in FIG. 6A; and FIG. 6C shows a configuration in which the excited frequency band becomes higher from the center to the external parts, contrary to the configuration shown in FIG. 6B. The frequency bands for the entire IDT can be designed almost same in the configurations shown in FIGS. 6B and 6C, but the aperture angle of the wave guide path becomes smaller for the higher frequency component. Consequently the range of the surface acoustic waves excitable by the entire IDT can be made wider by placing the high frequency exciting IDT portion at the center as shown in FIG. 6B, in comparison with the configuration shown in FIG. 6C.

As already explained in the foregoing, it is desirable that the frequency characteristics of the entire IDT are as flat as possible within the necessary frequency bands. In the above explained dog-legged structure, the IDT portions are mutually connected serially and have different distribution of electrical energy consumption in comparison with the parallel connection, so that the overlapping length of the electrode fingers in each IDT portion is different from that in the foregoing first to third embodiments.

[Embodiment 5]

Figure 7:
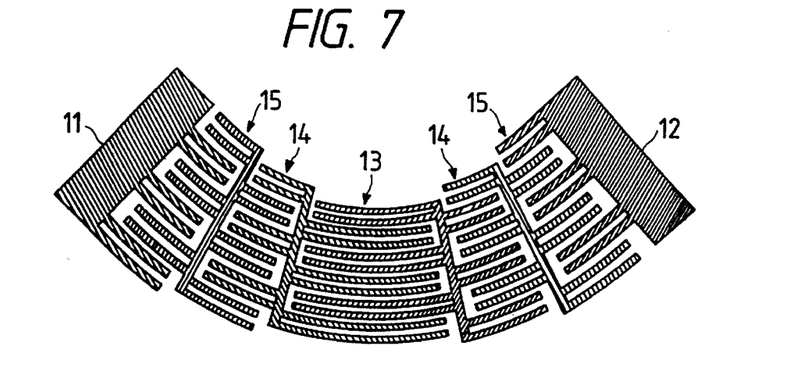
FIG. 7 is a view showing a configuration, as a fifth embodiment of the present invention, of a dog-legged IDT with double electrodes.

FIG. 7 illustrates a configuration in which the dog-legged IDT of the 4th embodiment is constructed with doubled electrodes, in order to suppress the reflection at the electrodes. Although FIG. 7 only illustrates the dog-legged configuration, such doubled electrode structure can also be employed in the configuration of the first, second or third embodiment.

[Embodiment 6]

Figure 8A:
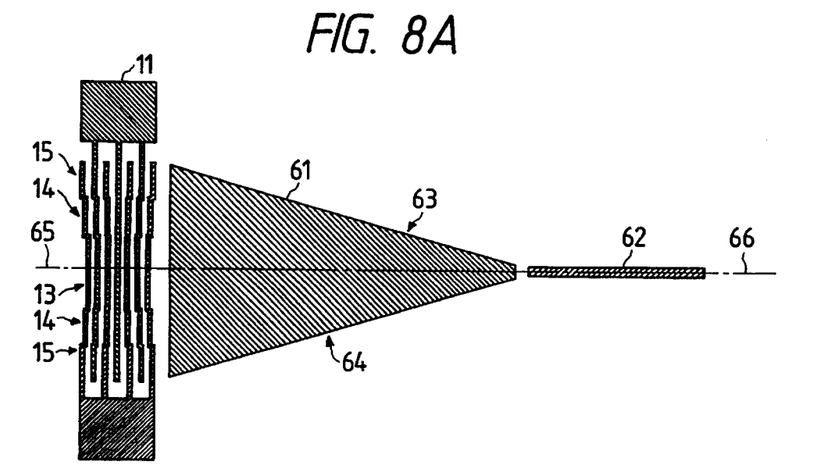
FIGS. 8A and 8B are schematic views showing configurations employing combination of an IDT with straight electrode fingers and a horn or an acoustic lens, as a sixth embodiment of the present invention.
Figure 8B:
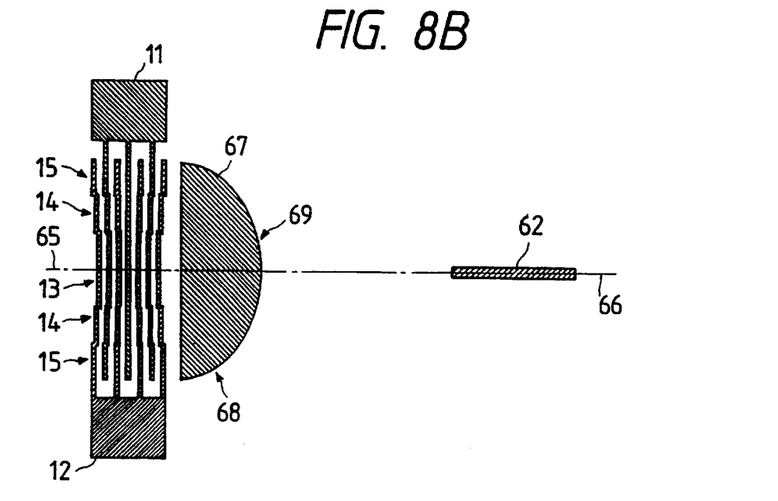

FIGS. 8A and 8B are schematic views in which the present invention is realized by the combination of an IDT with straight electrode fingers and a horn 61 or an acoustic lens 67. There are also shown a central line 65, 66 and a wave guide path 62.

In a convolver employing a piezoelectric material such as lithium niobate, the horn or the acoustic lens can be formed by depositing a thin conductive film by evaporation onto the surface of the piezoelectric material, as in the case of wave guide path, utilizing the variation of velocity (acoustic impedance) of the surface acoustic wave by such deposition. The horn 61 utilizes the total reflecting conditions on the lateral boundaries 63, 64, while the acoustic lens 67 utilizes the refractive condition at the boundaries 68, 69.

This embodiment requires complex designing of the horn or the acoustic lens for concentrating the surface acoustic lens, but the normal-shaped IDT facilitates the designing of the frequency characteristics and the phase characteristics, in comparison with the case of arc-shaped IDT.

This embodiment is also applicable to the configuration of the third or fourth embodiment.

[Embodiment 7]

Figure 9A:
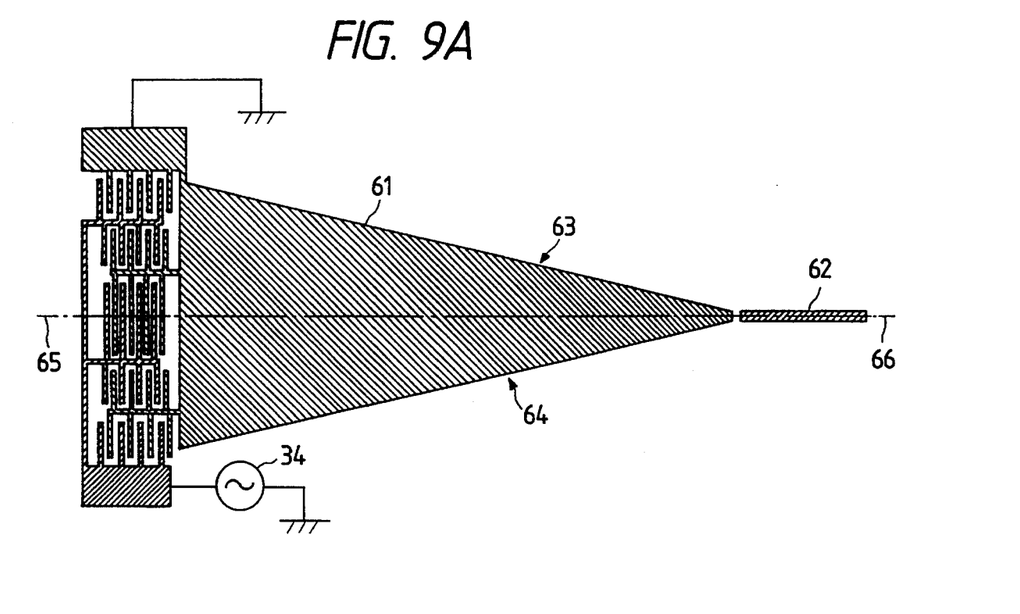
FIGS. 9A and 9B are schematic view showing configurations which, as a seventh embodiment of the present invention, employ a combination of an IDT with straight electrode fingers and a horn or an acoustic lens and in which the external circuit is non-equibrized and the wire of an electrode (ground electrode) of the IDT serves also as a shield electrode for avoiding so-called direct reaching wave between two IDT's of the convolver.
Figure 9B:
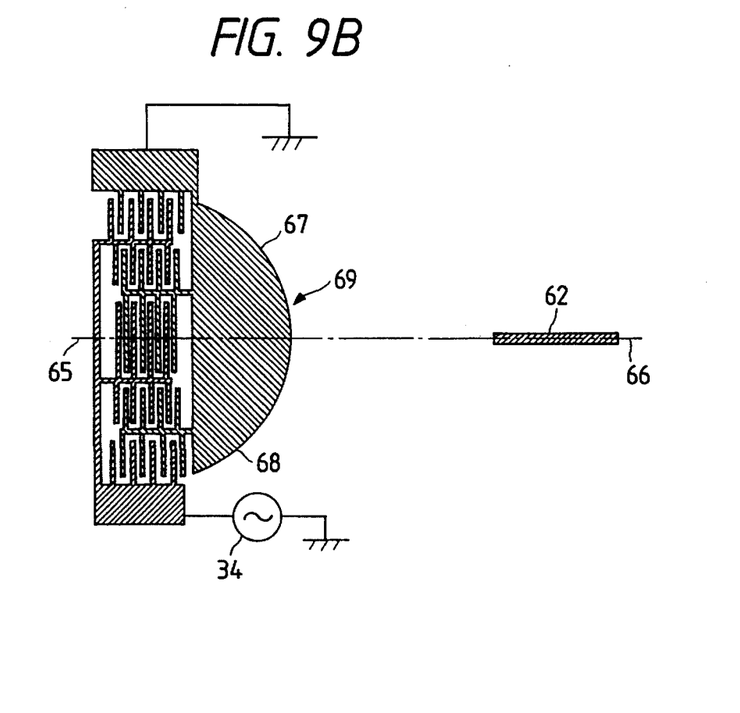

FIGS. 9A and 9B illustrate configurations in which the external circuit is a non-equilibrium circuit and the wire of an electrode (ground electrode) of the IDT serves also as a horn or an acoustic lens and as a shield electrode for eliminating so-called direct reaching wave between the two IDT's of the convolver.

The present embodiment may also be constructed with the doubled electrode structure.

Figure 10:
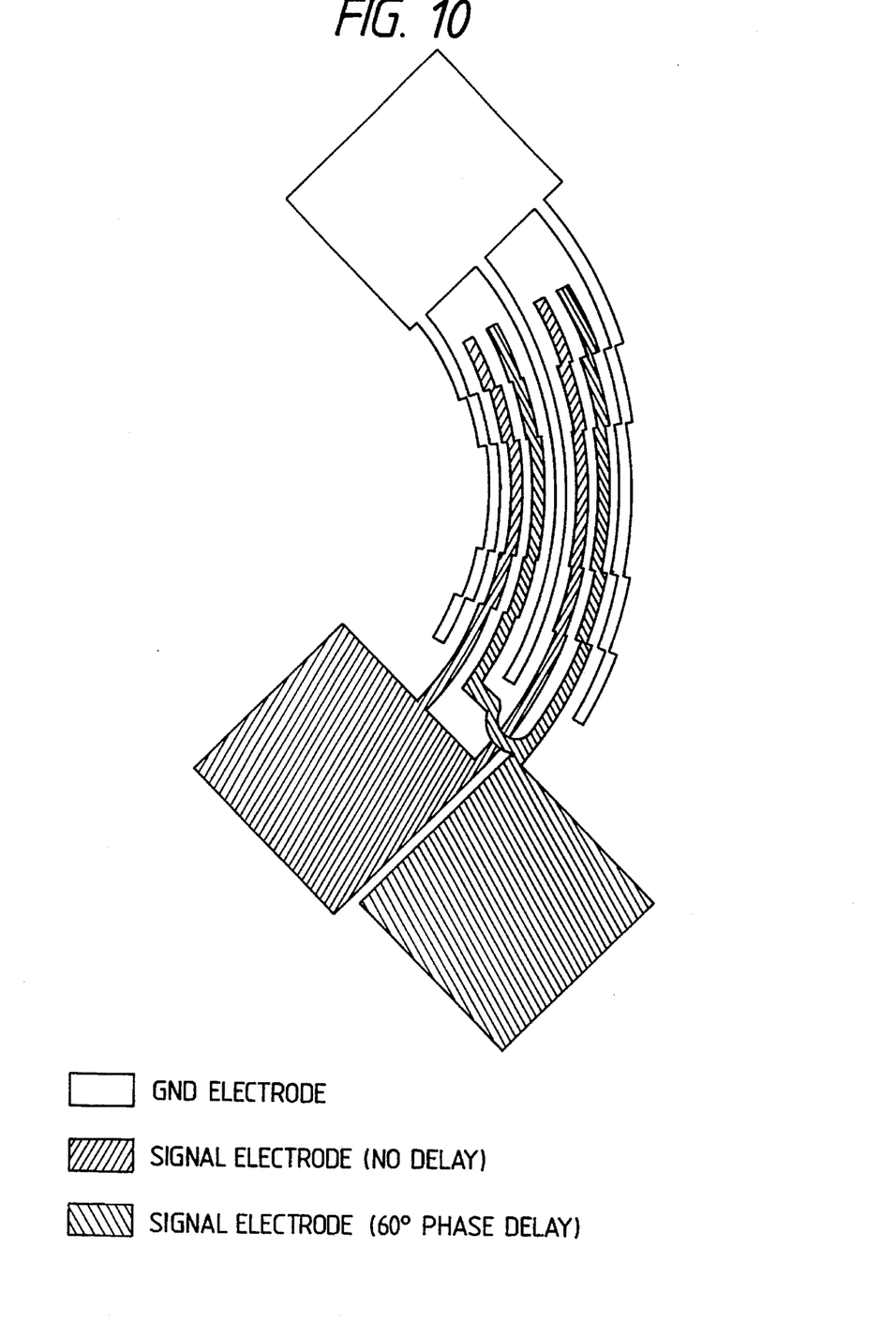
FIG. 10 is a schematic view showing the configuration in which the IDT shown in FIG. 4 is formed as three-phase type.

Furthermore, the input IDT of the present invention explained in the foregoing may also be constructed as so-called one-directional IDT, receiving an electrical signal of three or more phases and exciting the surface acoustic wave in one direction only. FIG. 10 shows a configuration of a one-directional IDT, obtained by modifying the configuration shown in FIG. 4 into a three-phase type.

Also in the foregoing description, the concentration of the surface acoustic wave is achieved by the use of an arc-shaped IDT or of a horn or an acoustic lens, but these means may also be employed in combination.

According to the present invention, as explained in the foregoing, the electrode fingers of the interdigital transducer are given plural portions of mutually different pitches, and these plural portions are arranged in a direction perpendicular to the propagating direction of the surface acoustic wave, whereby plural frequencies can be excited. Also the interdigital transducer is formed as an arc, concave to the wave guide path, thereby concentrating the generated surface acoustic wave and improving the efficiency.

Similar concentration of the surface acoustic wave may also be achieved by providing a horn or an acoustic lens, between the interdigital transducer and the wave guide path.

Such arrangement improves the coupling efficiency of the interdigital transducer and the wave guide path, thereby improving the entire efficiency of the convolver.

[Embodiment 8]

Figure 11:
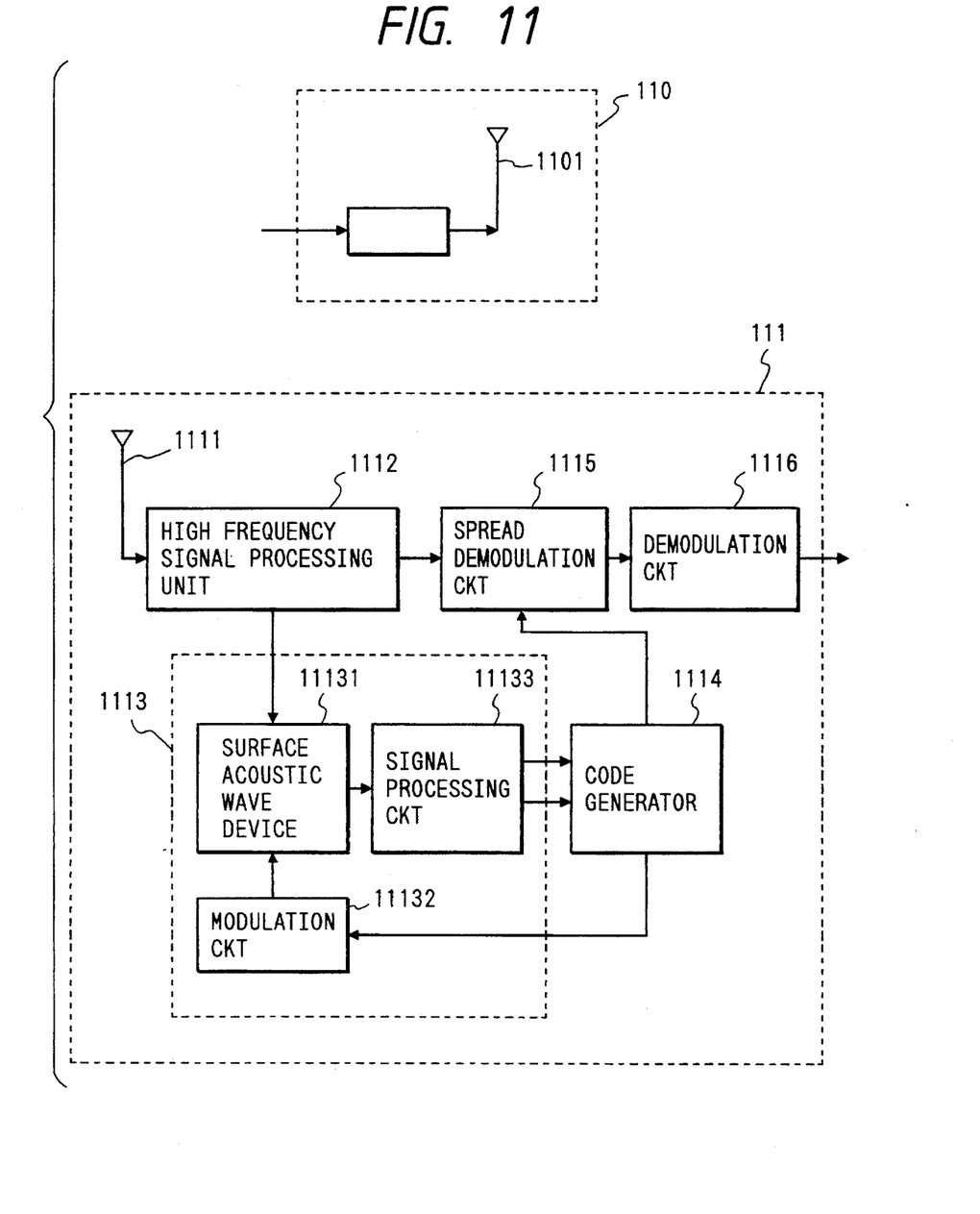
FIG. 11 is a block diagram of a communication system constituting an eighth embodiment of the present invention.

FIG. 11 is a block diagram showing an example of the communication system employing the above-explained surface acoustic wave device. A transmitter 110 modulates a signal to be transmitted by spread spectrum modulation employing spread codes, and transmits the modulated signal through an antenna 1101. The transmitted signal is received and decoded by a receiver 111, composed of an antenna 1111, a high frequency signal processing unit 1112, a synchronization circuit 1113, a code generator 1114, a spread demodulation circuit 1115, and a demodulation circuit 1116. The signal received by the antenna 1111 is subjected to suitable filtering and amplification in the high frequency signal processing unit 1112, and is released as a signal of the original transmission frequency band, or after conversion into a signal of a suitable intermediate frequency band. The above-mentioned signal is supplied to the synchronization circuit 1113, which is composed of a surface acoustic wave device 11131 as described in the foregoing embodiments of the present invention, a modulation circuit 11132 for modulating reference spread codes entered from the code generator 1114, and a signal processing circuit 11133 for processing a signal obtained from the surface acoustic wave device 11131 and supplying to the code generator 1114 a spread code synchronization signal and a clock synchronization signal for the transmitted signal. The surface acoustic wave device 11131 receives the output signal from the high frequency signal processing unit 1112 and the output signal from the modulation circuit 11132, and calculates the convolution of the two input signals. If the reference spread code supplied from the code generator 1114 to the modulation circuit 11132 is obtained by time inversion of the spread code sent from the transmitter, the surface acoustic wave device 11131 releases a correlation peak when a spread code component, exclusive for synchronization, contained in the received signal and the reference spread code mutually coincide on the wave guide path. The signal processing circuit 11133 detects the correlation peaks from the signal supplied from the surface acoustic wave device 11131, then determines the amount of aberration in the code synchronization, based on the time from the start of reference spread code to the output of the correlation peak, and supplies to the code generator 1114 the code synchronization signal and the clock signal. After the synchronization is established, the code generator 1114 generates a spread code which coincides, in the phase of spread code and clock signal, with the transmitted spread code. This spread code is supplied to the spread demodulation circuit 115 for restoring the signal prior to the spread modulation. The output signal of the spread demodulation circuit 1115 is a signal modulated with an ordinary modulation method such as frequency modulation or phase modulation, and can therefore be demodulated into original data by a demodulation circuit 1116 well known in the art.

[Embodiment 9]

Figure 12:
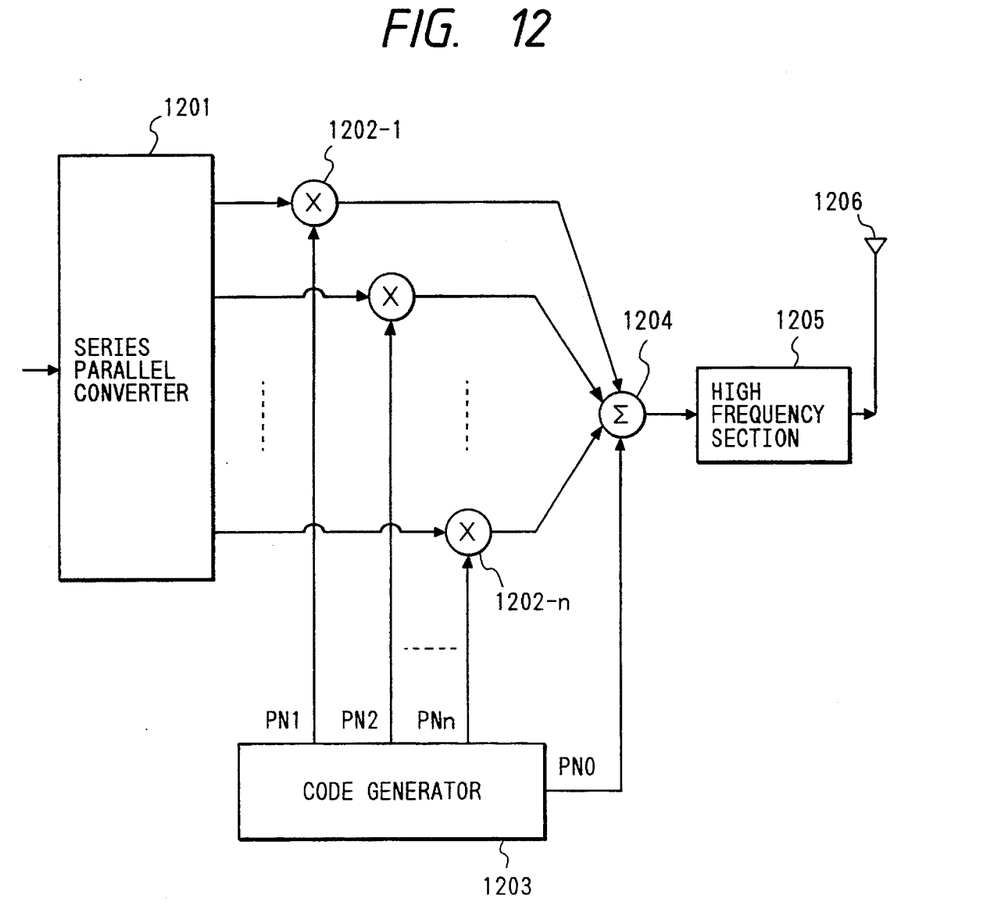
FIG. 12 is a block diagram of a transmitter of a ninth embodiment of the present invention.
Figure 13:
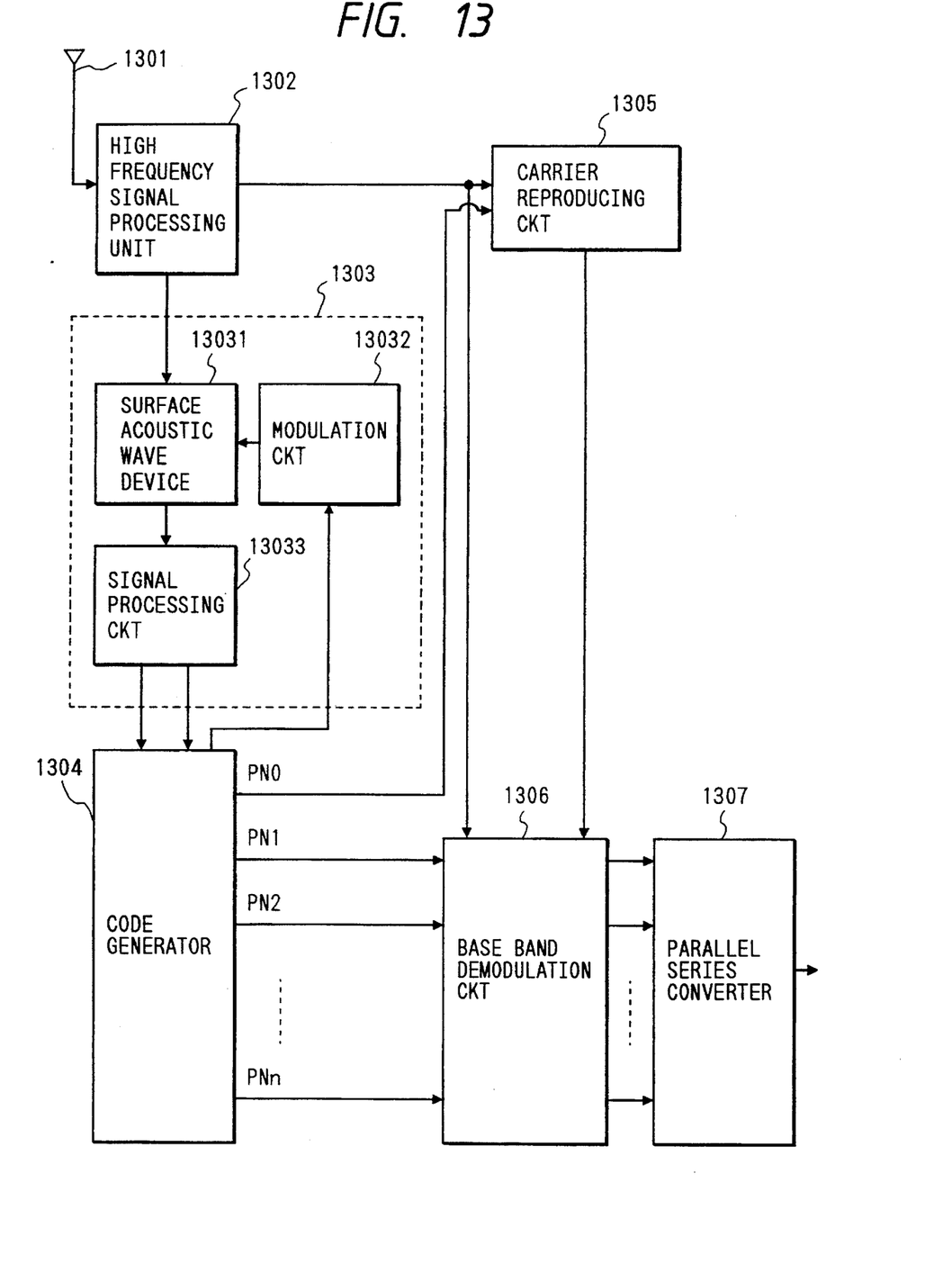
FIG. 13 is a block diagram of a receiver of the ninth embodiment.

FIGS. 12 and 13 are block diagrams showing an example of the transmitter and receiver, adapted for use in the above-explained communication system utilizing the surface acoustic wave device. In FIG. 12 there are shown a serial-parallel converter 1201 for converting serially entered data into n parallel data; multipliers 1201-1–n for multiplying respective parallel data with n spread codes released from the spread code generator; a spread code generator 1203 for generating mutually different n spread codes and a spread code exclusive for synchronization; an adder 1204 for adding the synchronizing spread code from the spread code generator 1203 and the n outputs of the multipliers 1202-1–n; a high frequency section 1205 for converting the output of the adder 1204 into a signal of transmission frequency; and a transmission antenna 1206. In FIG. 13 there are shown a receiving antenna 1301; a high frequency signal processing unit 1302; a synchronization circuit 1303 for capturing and maintaining the synchronization to the spread codes and the clock signal of the transmission side; a spread code generator 1304 for generating, based on the code synchronization signal and the clock signal supplied from the synchronization circuit 1303, (n+1) spread codes and reference spread code identical with the spread codes at the transmitting side; a carrier reproducing circuit 1305 for reproducing the carrier signal from a carrier reproducing spread code released from the spread code generator 1304 and from the output of the high frequency signal processing unit 1302; a base band demodulation circuit 1306 for effecting demodulation in the base band, utilizing the output of the carrier reproducing circuit 1305, the output of the high frequency signal processing unit 1302 and the n spread codes released from the spread code generator 1304; and a parallel-serial converter 1307 for effecting parallel-serial conversion on n demodulated parallel data released from the base band demodulation circuit 1306.

In the above-explained configuration, the entered data are at first converted, in the transmitting side, into n parallel data, equal to the number of signal multiplexing, by the serial-parallel converter 1201. On the other hand, the spread code generator 1203 generates mutually different (n+1) spread codes PN0–PNn of a same code cycle. Among these codes, PN0 is used exclusively for synchronization and carrier reproduction, and is not modulated by the aforementioned parallel data but is supplied directly to the adder 1204. The remaining n spread codes are modulated by n parallel data in the multipliers 1202-1–n and supplied to the adder 1204. The adder 1204 effects linear addition of the entered (n+1) signals and supplies to the high frequency section 1205 the added base band signal, which is converted in the high frequency section 1205 into a high frequency signal of a suitable central frequency, and is transmitted from the antenna 1206. At the receiving side, the signal received by the antenna 1301 is subjected to suitable filtering and amplification in the high frequency signal processing unit 1302, and is released as a signal in the original transmission frequency band or after conversion into a signal of a suitable intermediate frequency band. Said signal is supplied to the synchronization circuit 1303, which is composed of a surface acoustic device 13031 as described in the embodiments of the present invention, a modulation circuit 13032 for modulating a reference spread code supplied from the code generator 1304, and a signal processing circuit 13033 for processing the signal released from the surface acoustic wave device 13031 and supplying to the spread code generator 1304 a spread code synchronization signal and a clock synchronization signal for the transmitted signal. The surface acoustic wave device 13031 receives the output signal from the high frequency signal processing unit 1302 and the output signal from the modulation circuit 13032, and calculates the convolution of the two input signals. If the reference spread code supplied from the code generator 1304 to the modulation circuit 13032 is obtained by time inversion of the synchronizing spread code sent from the transmitting side, the surface acoustic wave device 13031 releases a correlation peak when a synchronizing spread code component contained in the received signal coincides with the reference spread code on the wave guide path of the surface acoustic wave device 13031. The signal processing circuit 13033 detects the correlation peak from the signal supplied from the surface acoustic wave device 13031, then determines the amount of aberration of the code synchronization based on the time from the start of reference spread code to the output of the correction peak, and supplies to the spread code generator 1304 the code synchronization signal and the clock signal. After the establishment of synchronization, the spread code generator 1304 generates spread codes, which coincide, in the phase of spread codes and in the clock, with the spread codes of the transmitting side. Among these codes, the spread code PN0 for synchronization is supplied to the carrier reproducing circuit 1305 which, utilizing said spread code PN0, inversely spreads the received signal of the transmission frequency band or the intermediate frequency band supplied from the high frequency processing unit 1302, thereby reproducing the carrier of the transmission frequency band or the intermediate frequency band. The carrier reproducing circuit 1305 is composed, for example, of a circuit utilizing a phase locked loop. The received signal is multiplied by the synchronizing spread code PN0 in the multiplier. After the establishment of synchronization, the synchronizing spread code in the received signal and the reference synchronizing spread code mutually coincide in the clock and in the code phase. As the synchronizing spread code of the transmitting side is not modulated with data, it provides the carrier component when inversely spread in the multiplier. Thus obtained output is supplied to a band pass filter to extract the carrier component only. This output is then supplied to an already known phase locked loop circuit, composed of a phase detector, a loop filter and a voltage-controlled oscillator, and the oscillator provides a reproduced carrier signal, which is locked in phase with the carrier component released from the band pass filter. The reproduced carrier is supplied to the base band reproducing circuit 1306, which generates a base band signal from said reproduced carrier and the output of the high frequency signal processing unit 1302. The base band signal is distributed into n, then inversely spread in each code divided channel by the spread codes PN1–PNn released from the spread code generator 1304, and is subjected to data demodulation. The demodulated n parallel data are then converted into serial data by the parallel-serial converter 1307 to be outputted.

The present embodiment describes a case of binary modulation, but there may also be employed other modulating methods such as orthogonal modulation.

[Embodiment 10]

Figure 14:
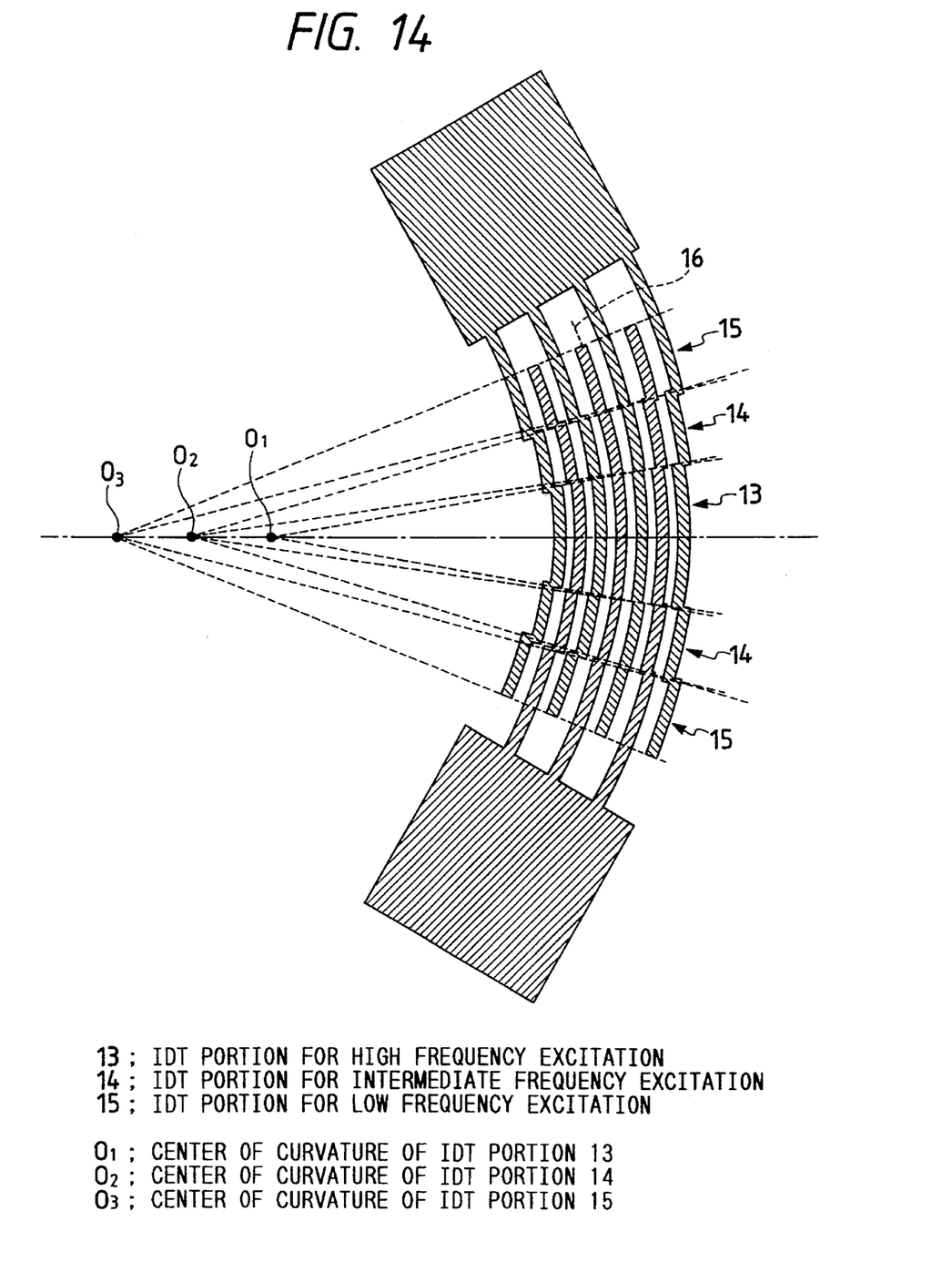
FIG. 14 is a schematic view showing the configuration of IDT portions according to one embodiment of the present invention.

The embodiment 1 shows the construction such that the respective IDT portions for high frequency excitation to low frequency excitation have the same center of curvature. FIG. 14 is a schematic view showing the structure of IDT portions according to this embodiment 10. In this embodiment, the configuration of the input IDT is so constructed as to match the angular dependency of a surface acoustic wave. In this embodiment, the IDT is structured such that a line 16 connecting the excitation centers of the respective frequency exciting portions is so located as to be substantially equal phase from the wave guide path. The detail on this matter is discussed in Japanese Laid-Open Patent Application No. 6-314946. In this embodiment, the respective exciting portions have circular arc shapes but the centers of curvature of the respective exciting portions are different from one another. In this embodiment, the center of curvature of the IDT portion 13 for high frequency excitation is smallest among them while the center of curvature of the IDT portion 15 for low frequency excitation is largest. If the propagation velocity of a surface acoustic wave has an angular dependency, the focus position of the high frequency exciting IDT portion 13 in FIG. 3B becomes farther while the focus position of the low frequency exciting IDT portion 15 in FIG. 3B becomes nearer, since the respective IDT portions define different angles with respect to the crystal axis of the substrate. For this reason, there is a possibility to lower the coupling efficiency with the guided mode in case of large angular dependency of the propagation velocity of the surface acoustic wave. In contrast, when the IDT portions are constructed according to this embodiment, the focus positions of the respective IDT portions are located at a substantially same position, and thereby realizing high coupling efficiency over a broader band region.

What is claimed is:

1. A surface acoustic wave device comprising:

a piezoelectric substrate;

a wave guide path provided on said piezoelectric substrate, for guiding a surface acoustic wave; and an interdigital transducer provided on said piezoelectric substrate, for exciting a surface acoustic wave, said interdigital transducer being provided with plural portions of mutually different pitches of electrode fingers, respectively corresponding to different frequencies, said portions being arranged in parallel manner along a direction perpendicular to the propagating direction of the surface acoustic wave;

wherein the surface acoustic wave generated by said interdigital transducer is entered in concentrated manner into said wave guide path.

2. A surface acoustic wave device according to claim 1, wherein means for the concentrated entry is comprised, in said interdigital transducer, of an arc-shaped structure of the electrode fingers, concave to said wave guide path.

3. A surface acoustic wave device according to claim 2, wherein the length of a portion which connects an overlapping portion of the electrode fingers of the interdigital transducer and a pad portion for electric power supply to the electrode fingers is shortened within an extent that the surface acoustic wave excited by the interdigital transducer does not proceed to said pad portion.

4. A surface acoustic wave device according to claim 1, wherein means for the concentrated entry comprises a horn provided between said interdigital transducer and said wave guide path.

5. A surface acoustic wave device according to claim 1, wherein means for the concentrated entry comprises an acoustic lens provided between said interdigital transducer and said wave guide path.

6. A surface acoustic wave device according to claim 1, wherein said plural portions of different pitches of the electrode fingers of the interdigital transducer are positioned symmetrically with respect to the center of said interdigital transducer.

7. A surface acoustic wave device according to claim 6, wherein the symmetrical positioning is made in such a manner that the portion with a wider pitch of the electrode fingers is positioned farther from the center.

8. A surface acoustic wave device according to claim 1, wherein plural portions of different pitches of the electrode fingers of the interdigital transducer are connected in parallel.

9. A surface acoustic wave device according to claim 1, wherein plural portions of different pitches of the electrode fingers of the interdigital transducer are connected in series.

10. A surface acoustic wave device according to claim 9, wherein the electrode fingers are shaped in dog-legged manner to achieve serial connection.

11. A surface acoustic wave device according to claim 1, wherein electrical energy is supplied to the electrode fingers of the interdigital transducer from three or more points.

12. A surface acoustic wave device according to claim 1, wherein the interdigital transducer is comprised of doubled electrode fingers.

13. A surface acoustic wave device according to claim 1, where in the interdigital transducer is provided with one-directional property.

14. A surface acoustic wave device comprising:

a piezoelectric substrate;

plural interdigital transducers provided on said piezoelectric substrate, for exciting surface acoustic waves, each of said interdigital transducers being provided with plural portions of mutually different pitches of electrode fingers, respectively corresponding to different frequencies, and said portions being arranged in parallel manner in a direction perpendicular to the propagating direction of the surface acoustic waves; and a wave guide path provided on said piezoelectric substrate, for outputting a convolution signal by the surface acoustic waves excited by said plural interdigital transducers;

wherein the surface acoustic waves generated by said interdigital transducers are entered in concentrated manner into said wave guide path.

15. A surface acoustic wave device according to claim 14, wherein means for the concentrated entry is comprised, in said interdigital transducers, of an arc-shaped structure of the electrode fingers, concave to said wave guide path.

16. A surface acoustic wave device according to claim 15, wherein the length of a portion which connects an overlapping portion of the electrode fingers of the interdigital transducer and a pad portion for electric power supply to the electrode fingers is shortened within an extent that the surface acoustic wave excited by the interdigital transducer does not proceed to said pad portion.

17. A surface acoustic wave device according to claim 14, wherein means for the concentrated entry comprises a horn provided between said interdigital transducer and said wave guide path.

18. A surface acoustic wave device according to claim 14, wherein means for the concentrated entry comprises an acoustic lens provided between said interdigital transducer and said wave guide path.

19. A surface acoustic wave device according to claim 14, wherein said plural portions of different pitches of the electrode fingers of the interdigital transducer are positioned symmetrically with respect to the center of said interdigital transducer.

20. A surface acoustic wave device according to claim 19, wherein the symmetrical positioning is made in such a manner that the portion with a wider pitch of the electrode fingers is positioned farther from the center.

21. A surface acoustic wave device according to claim 14, wherein plural portions of different pitches of the electrode fingers of the interdigital transducer are connected in parallel.

22. A surface acoustic wave device according to claim 14, wherein plural portions of different pitches of the electrode fingers of the interdigital transducer are connected in series.

23. A surface acoustic wave device according to claim 22, wherein the electrode fingers are shaped in dog-legged manner to achieve serial connection.

24. A surface acoustic wave device according to claim 14, wherein electrical energy is supplied to the electrode fingers of the interdigital transducer from three or more points.

25. A surface acoustic wave device according to claim 14, wherein the interdigital transducer is comprised of doubled electrode fingers.

26. A surface acoustic wave device according to claim 14, wherein the interdigital transducer has one-directional property.

27. A signal receiver comprising:

a code generator for generating a reference signal;

a surface acoustic wave device for outputting a convolution signal of a received signal and the reference signal; and a circuit for demodulating information, using the convolution signal outputted from the surface acoustic wave device;

wherein said surface acoustic wave device includes:

a piezoelectric substrate;

plural interdigital transducers provided on said piezoelectric substrate, for exciting surface acoustic waves, each of said interdigital transducers being provided with plural portions of mutually different pitches of electrode fingers, respectively corresponding to different frequencies, and said portions being arranged in parallel manner in a direction perpendicular to the propagating direction of the surface acoustic waves; and a wave guide path provided on said piezoelectric substrate, for outputting a convolution signal by the surface acoustic waves excited by said plural interdigital transducers;

wherein the surface acoustic waves generated by said interdigital transducers are entered in concentrated manner into said wave guide path.

28. A communication system comprising:

a transmitter for transmitting a signal modulated according to information; and a receiver including:

a code generator for generating a reference signal;

a surface acoustic wave device for outputting a convolution signal of a received signal and the reference signal; and a circuit for demodulating information, using the convolution signal outputted from said surface acoustic wave device, said surface acoustic wave device including:

a piezoelectric substrate;

plural interdigital transducers provided on said piezoelectric substrate, for exciting surface acoustic waves; each of said interdigital transducers being provided with plural portions of mutually different pitches of the electrode fingers, respectively corresponding to different frequencies, and said portions being arranged in parallel manner in a direction perpendicular to the propagating direction of the surface acoustic waves; and a wave guide path provided on said piezoelectric substrate, for outputting a convolution signal by the surface acoustic wave excited by said plural interdigital transducers;

wherein the surface acoustic waves generated by said interdigital transducers in said surface acoustic wave device are entered in concentrated manner into said wave guide path.

\* \* \* \* \*